(12) United States Patent
Wu

(10) Patent No.: US 9,074,757 B1
(45) Date of Patent: Jul. 7, 2015

(54) CHRISTMAS LIGHT

(71) Applicant: Linlin Wu, Fujian (CN)

(72) Inventor: Linlin Wu, Fujian (CN)

(*) Notice: Subject to any disclaimer, the term of this patent is extended or adjusted under 35 U.S.C. 154(b) by 0 days.

(21) Appl. No.: 14/264,004

(22) Filed: Apr. 28, 2014

(51) Int. Cl.
*F21V 23/02* (2006.01)
*F21V 17/12* (2006.01)
*H05K 1/14* (2006.01)
*F21W 121/04* (2006.01)
*F21Y 101/02* (2006.01)

(52) U.S. Cl.
CPC ............. *F21V 23/02* (2013.01); *F21V 17/12* (2013.01); *H05K 1/14* (2013.01); *F21W 2121/04* (2013.01); *F21Y 2101/02* (2013.01); *H05K 2201/10106* (2013.01)

(58) Field of Classification Search
USPC ............ 362/249.02, 311.02, 351, 355, 29.19, 362/800, 649, 650, 249.14
See application file for complete search history.

(56) References Cited

U.S. PATENT DOCUMENTS

| 6,819,056 B2 * | 11/2004 | Lin | 315/185 S |
| 2011/0075431 A1 * | 3/2011 | Wu | 362/373 |
| 2011/0310623 A1 * | 12/2011 | Lin | 362/362 |
| 2012/0032577 A1 * | 2/2012 | Huang | 313/318.01 |

* cited by examiner

*Primary Examiner* — Laura Tso

(57) ABSTRACT

A novel Christmas light comprises a head and a shade. A lighting device is mounted inside the shade. The lighting device comprises an LED light, a printed circuit board and a power supply module. The LED light is a patch type LED light. The printed circuit board comprises a first printed circuit board and a second printed circuit board. The first printed circuit board is positioned upright. The second printed circuit board is placed flat below the first printed circuit board. The first printed circuit board and the second printed circuit board are perpendicular to each other and fixedly connected with each other. The patch type LED light is welded to a lower bottom surface of the second printed circuit board. The power supply module is mounted on the first printed circuit board. The first printed circuit board and the head are fixedly connected with each other.

2 Claims, 4 Drawing Sheets

CHRISTMAS LIGHT

BACKGROUND OF THE INVENTION

The present invention relates to a decoration light, and more specifically relates to a decoration light hung on a Christmas tree.

Decoration lights for festive embellishment during Christmas are often hung on houses or on Christmas trees. An existing decoration light as shown in FIGS. 1 and 2 has a structure generally comprising a head 1' and a shade 2'. The shade 2' has a flame shape. A first end of the shade 2' and the head 1' are removably connected by screws. A lighting device 3' is mounted inside the shade 2' and a lighting surface of the lighting device 3' faces towards a second end of the shade 2'. The lighting device 3' comprises an LED light 31', a printed circuit board 32' and a power supply module 33'. The first end of the shade 2' is an upper end. The second end of the shade 2' is a lower end. The LED light 31' is a direct insert type LED light. The printed circuit board 32' is positioned upright along a direction from the upper end to the lower end. Two pins of the direct insert type LED light have their end portions welded to a lower end portion of the printed circuit board 32'. The power supply module 33' is mounted on the printed circuit board 32'. The printed circuit board 32' and the head 1' are fixed with respect to each other. The head 1', the power supply module 33' and the LED light 31' are electrically connected in sequential order.

In this kind of decoration light, the LED light 31' is a direct insert type LED light. In general, the overall length of a direct insert type LED light is longer, but the overall length of the shade 2' is not long. Therefore, the direct insert type LED light occupies most of the spaces of the shade when it is installed inside the shade. Accordingly, the distance between the second end portion of the shade 2' and the lighting end portion of the direct insert type LED light is shorter, thereby causing the problems of light spot and dark zone and thus resulting in uneven lighting. Furthermore, since the chips of the direct insert type LED light are distant from the printed circuit board, the heat energy of the direct insert type LED light cannot be quickly dispersed. As such, this kind of decoration light has poorer heat dissipation effect and shorter service life.

The present invention is disclosed in view of the disadvantages now present in the prior arts.

BRIEF SUMMARY OF THE INVENTION

The present invention provides a novel Christmas light which does not have the problems of light spot and dark zone and has the advantages of even lighting effect, better heat dissipation effect and longer service life.

The present invention adopts the following technical proposal:

A novel Christmas light comprising a head and a shade; a first end of the shade and the head are removably connected by screws; a lighting device is mounted inside the shade and a lighting surface of the lighting device faces towards a second end of the shade; the lighting device comprises an LED light, a printed circuit board and a power supply module; the power supply module is mounted on the printed circuit board; the head, the power supply module and the LED light are electrically connected in sequential order; the LED light is a patch type LED light; the first end of the shade is an upper end; the second end of the shade is a lower end; the printed circuit board comprises a first printed circuit board and a second circuit board; the first printed circuit board is positioned upright along a direction from the upper end to the lower end; the second printed circuit board is placed flat below the first printed circuit board; the first printed circuit board and the second printed circuit board are perpendicular to each other and fixedly connected with each other; the patch type LED light is welded to a lower bottom surface of the second printed circuit board; the power supply module is mounted on the first printed circuit board; the first printed circuit board and the head are fixedly connected with each other.

A space exists between the first printed circuit board and the second printed circuit board; one side at a back surface of the second printed circuit board and a corresponding side at the first printed circuit board are spot welded with each other via a spot welding block.

According to the novel Christmas light of the present invention, the LED light is a patch type LED light. The overall length of a patch type LED light is shorter than the overall length of a direct insert type LED. Accordingly, the distance between the second end portion of the shade and the lighting end portion of the LED light is increased. As such, the problems of light spot and dark zone are prevented and the lighting becomes more even. Also, since the chips of a patch type LED light adhere and match with the second printed circuit board, the heat energy generated by an operating patch type LED light can be quickly dispersed. As such, the decoration light has significantly improved heat dissipation effect and longer service life. Besides, due to the space between the first printed circuit board and the second printed circuit board, the heat energy generated by the operating LED light at the second printed circuit board can be prevented from transmitting to the power supply module at the first printed circuit board, and the heat energy generated by the operating power supply module at the first printed circuit board can be prevented from transmitting to the LED light of the second printed circuit board. Accordingly, the service life of the LED light will not be affected by the heat energy of the operating power supply module, and the service life of the power supply module will not be affected by the heat energy of the operating LED light.

DETAILED DESCRIPTION OF THE INVENTION

Figure 1:
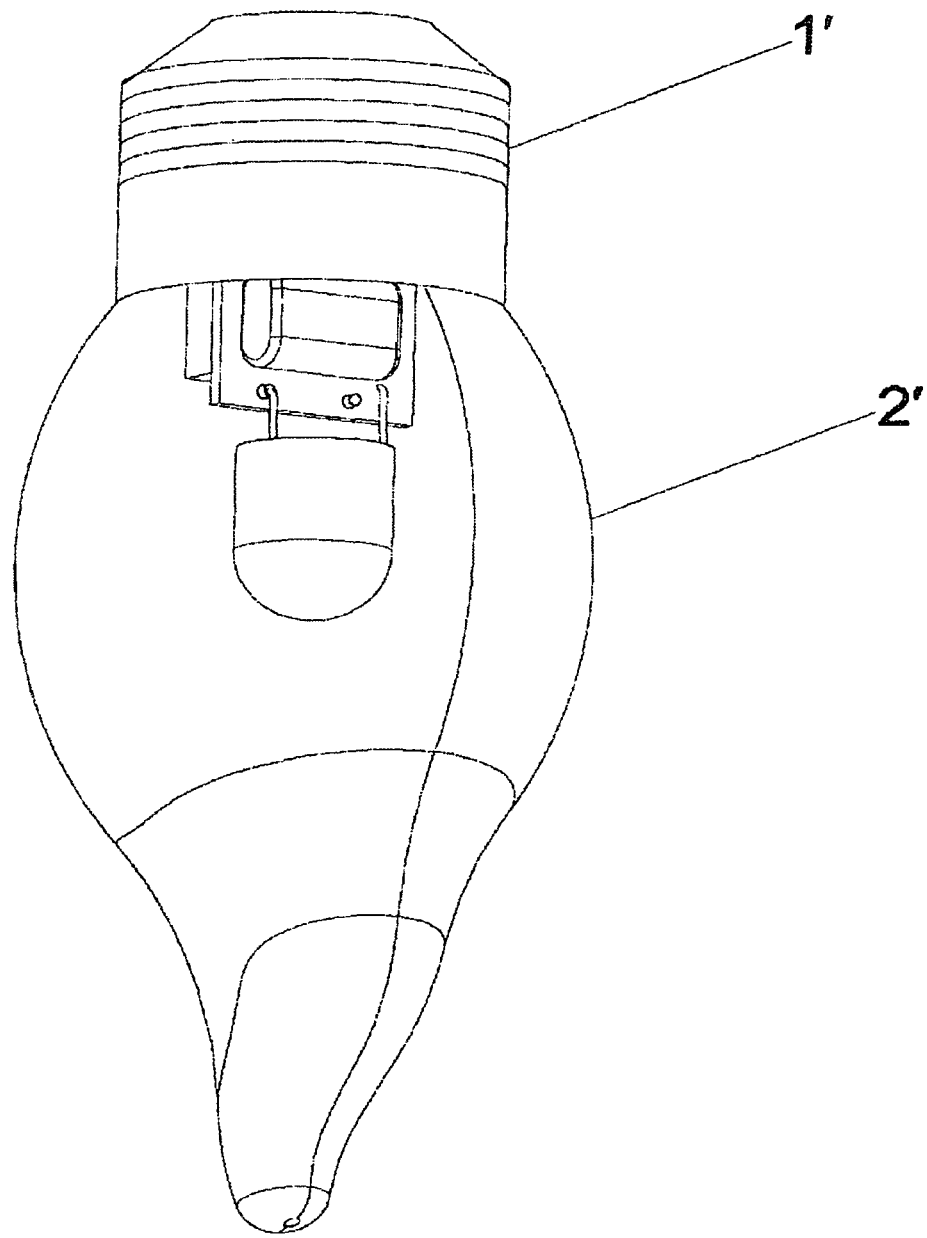
FIG. 1 is a perspective view of a decoration light according to existing prior arts.
Figure 2:
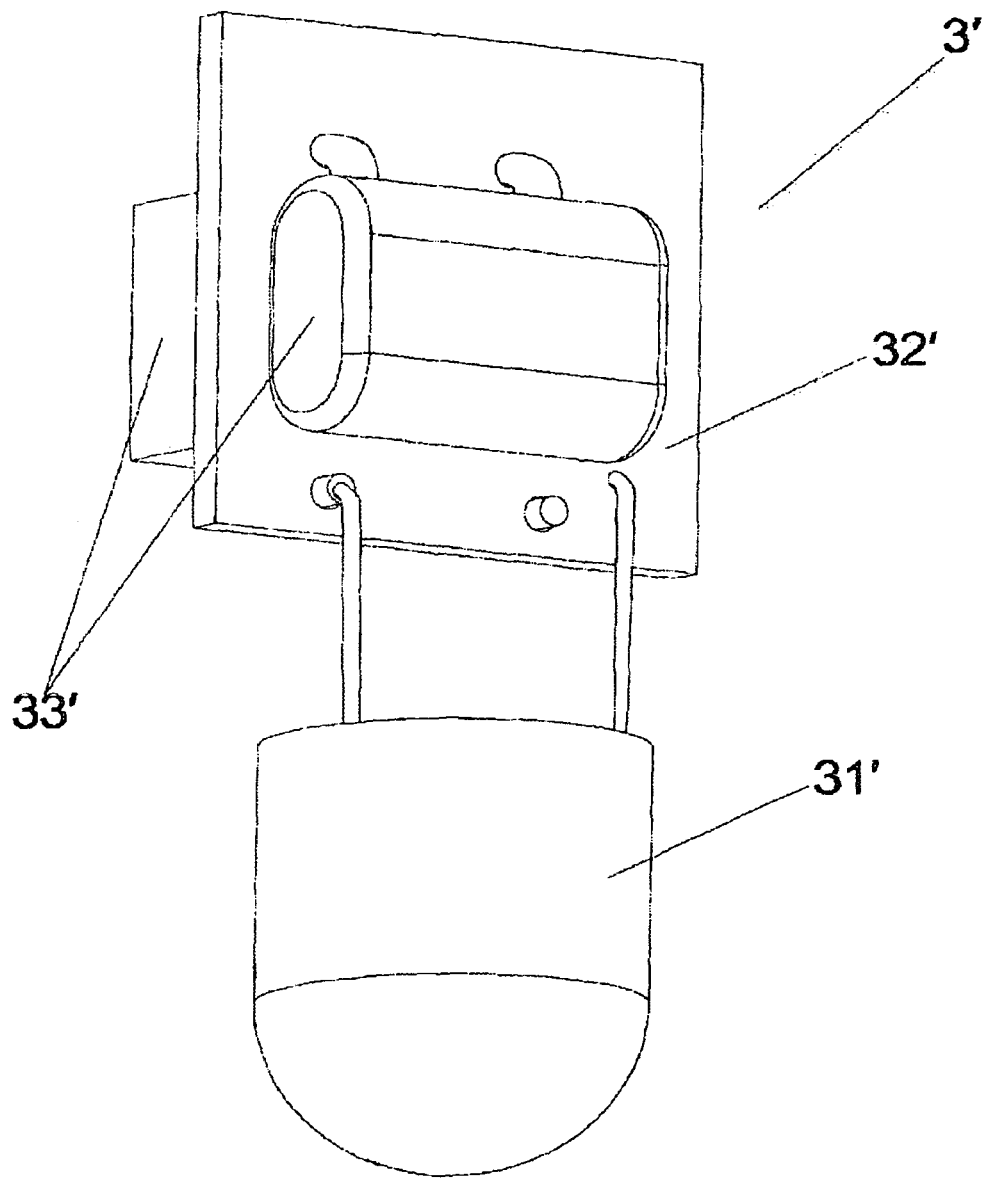
FIG. 2 is a perspective view of a lighting device of a decoration light according to existing prior art.
Figure 3:
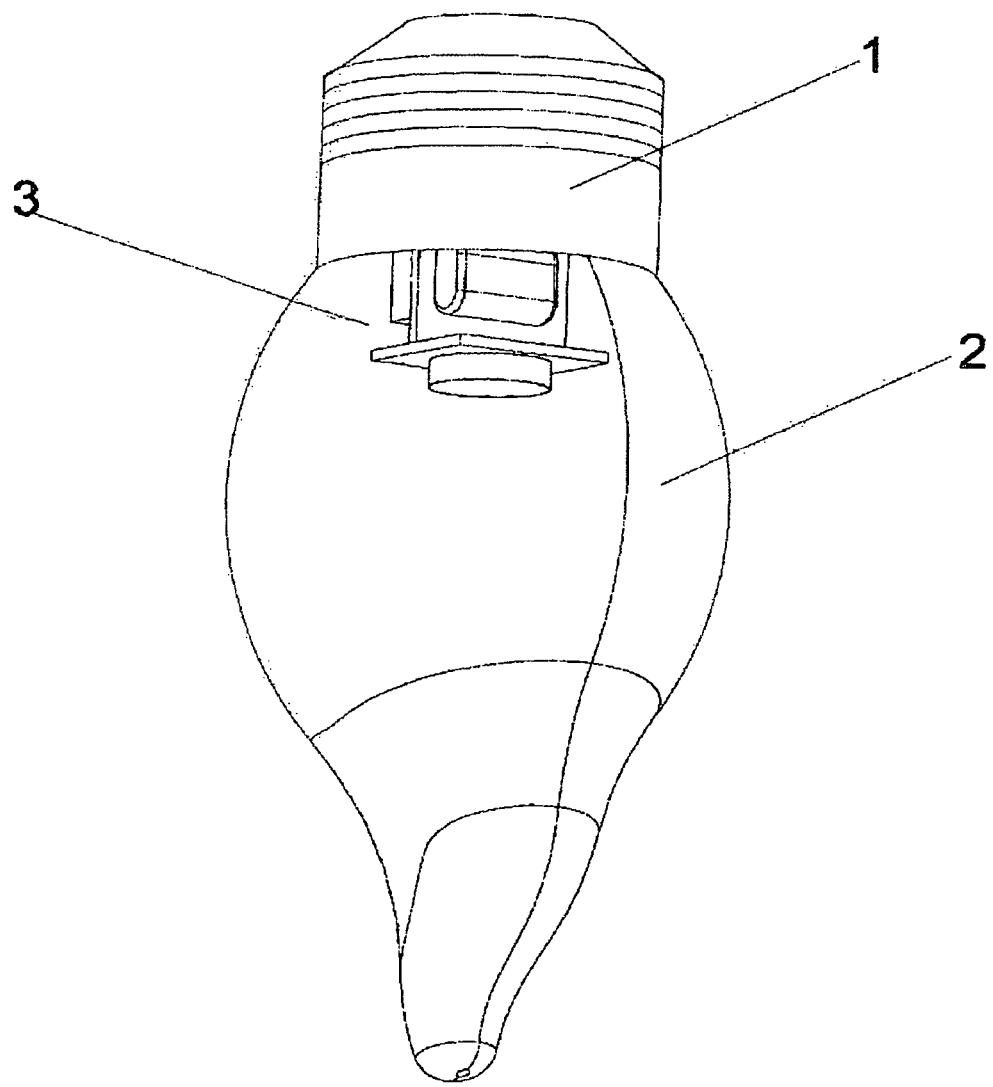
FIG. 3 is a perspective view of the present invention.
Figure 4:
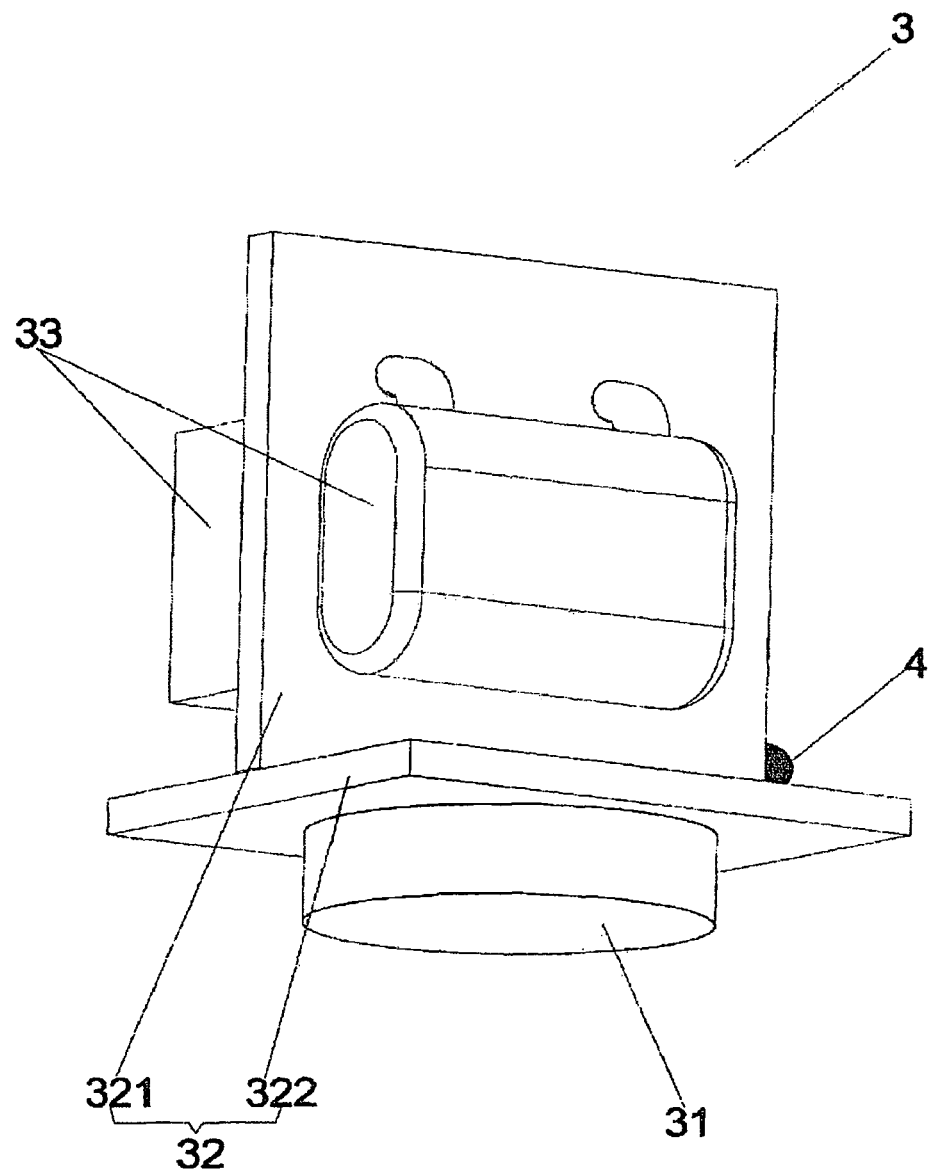
FIG. 4 is a perspective view of a lighting device according to the present invention.

As shown in FIGS. 3 and 4, a novel Christmas light of the present invention comprises a head 1 and a shade 2. The shade 2 has a flame shape. A first end of the shade 2 and the head 1 are removably connected by screws. A lighting device 3 is mounted inside the shade 2 and a lighting surface of the lighting device 3 faces towards a second end of the shade 2. The lighting device 3 comprises an LED light 31, a printed circuit board 32 and a power supply module 33. The first end of the shade 2 is an upper end. The second end of the shade 2 is a lower end. The LED light 31 is a patch type LED light. The printed circuit board 32 comprises a first printed circuit board 321 and a second circuit board 322. The first printed circuit board 321 is positioned upright along a direction from the upper end to the lower end. The second printed circuit board 322 is placed flat below the first printed circuit board 321. The first printed circuit board 321 and the second printed circuit board 322 are perpendicular to each other and fixedly connected with each other. A space (not shown in the figures) exists between the first printed circuit board 321 and the second printed circuit board 322. One side at a back surface of the second printed circuit board 322 and a corresponding side at the first printed circuit board 321 are spot welded with each other via a spot welding block 4. Use of the spot welding block 4 can on one hand fixedly connect the first printed circuit board 321 with the second printed circuit board 322, and on the other hand electrically connect the power supply module 33 with the LED light 31. The patch type LED light is welded to a lower bottom surface of the second printed circuit board 322. The power supply module 33 is mounted on the first printed circuit board 321. An upper end of the first printed circuit board 321 is fixedly connected with the head 1 via pins. The head 1, the power supply module 33 and the LED light 31 are electrically connected in sequential order.

According to the novel Christmas light of the present invention, the LED light 31 is a patch type LED light. The overall length of a patch type LED light is shorter than the overall length of a direct insert type LED. Accordingly, the distance between the second end portion of the shade and the lighting end portion of the LED light 31 is increased. As such, the problems of light spot and dark zone are prevented and the lighting becomes more even. Also, since the chips of a patch type LED light adhere and match with the second printed circuit board 322, the heat energy generated by an operating patch type LED light can be quickly dispersed. As such, the decoration light has significantly improved heat dissipation effect and longer service life. Besides, due to the space between the first printed circuit board 321 and the second printed circuit board 322, the heat energy generated by the operating LED light 31 at the second printed circuit board 322 can be prevented from transmitting to the power supply module 33 at the first printed circuit board 321, and the heat energy generated by the operating power supply module 33 at the first printed circuit board 321 can be prevented from transmitting to the LED light 31 of the second printed circuit board 322. Accordingly, heat insulation is achieved so that the service life of the LED light 31 will not be affected by the heat energy of the operating power supply module 33, and the service life of the power supply module 33 will not be affected by the heat energy of the operating LED light 31, thereby preventing the problems existing in the prior art where the power supply module 33 and the LED light 31 have shorter service lives because the heat energy of the power supply module 33 and the heat energy of the LED light 31 are not separable due to the fact that the power supply module 33 and the LED light 31 are positioned on the same printed circuit board.

What is claimed is:

1. A novel Christmas light comprising a head and a shade; a first end of the shade is an upper end; a second end of the shade is a lower end; a lighting device is mounted inside the shade and a lighting surface of the lighting device faces towards the second end of the shade; the lighting device comprises an LED light, a printed circuit board and a power supply module; the power supply module is mounted on the printed circuit board: the head, the power supply module and the LED light are electrically connected in sequential order; the novel Christmas light is characterized in that, the LED light is a patch type LED light; the printed circuit board comprises a first printed circuit board and a second circuit board; the first printed circuit board is positioned upright along a direction from the upper end to the lower end; the second printed circuit board is placed flat below the first printed circuit board; the first printed circuit board and the second printed circuit board are perpendicular to each other and fixedly connected with each other; the patch type LED light is welded to a lower bottom surface of the second printed circuit board; the power supply module is mounted on the first printed circuit board; the first printed circuit board and the head are fixedly connected with each other.

2. The novel Christmas light as in claim 1, wherein a space exists between the first printed circuit board and the second printed circuit board; one side at a back surface of the second printed circuit board and a corresponding side at the first printed circuit board are spot welded with each other via a spot welding block.

* * * * *